United States Patent [19]

Perry et al.

[11] Patent Number: 6,084,175

[45] Date of Patent: Jul. 4, 2000

[54] FRONT CONTACT TRENCHES FOR POLYCRYSTALLINE PHOTOVOLTAIC DEVICES AND SEMI-CONDUCTOR DEVICES WITH BURIED CONTACTS

[75] Inventors: James M. Perry, Hagerstown; Srinvasamohan Narayanan, Middletown; John H. Wohlgemuth, Ijamsville; Steven P. Roncin, Middletown, all of Md.

[73] Assignee: Amoco/Enron Solar, Frederick, Md.

[21] Appl. No.: 08/557,286

[22] Filed: Nov. 14, 1995

Related U.S. Application Data

[63] Continuation-in-part of application No. 08/422,051, Apr. 14, 1995, which is a continuation-in-part of application No. 08/342,736, Nov. 21, 1994, which is a division of application No. 08/065,191, May 20, 1993, abandoned.

[51] Int. Cl.$^7$ .............................. H01L 31/06; H01L 31/18
[52] U.S. Cl. ......................... 136/256; 257/436; 257/466; 437/2; 437/203
[58] Field of Search ............................. 136/256; 257/436, 257/466; 437/2, 4–5, 203

[56] References Cited

U.S. PATENT DOCUMENTS

| | | | |
|---|---|---|---|
| 3,163,916 | 1/1965 | Gault | 437/164 |
| 4,097,986 | 7/1978 | Henry et al. | 437/227 |
| 4,227,942 | 10/1980 | Hall | 136/255 |
| 4,355,457 | 10/1982 | Barlett et al. | 437/15 |
| 4,726,850 | 2/1988 | Wenham et al. | 136/256 |
| 4,748,130 | 5/1988 | Wenham et al. | 437/2 |
| 5,024,970 | 6/1991 | Mori | 437/226 |
| 5,081,049 | 1/1992 | Green et al. | 437/2 |
| 5,100,808 | 3/1992 | Glenn | 437/2 |
| 5,131,954 | 7/1992 | Vogeli et al. | 136/244 |
| 5,221,365 | 6/1993 | Noguchi et al. | 136/258 |
| 5,258,077 | 11/1993 | Shahryar | 136/256 |

FOREIGN PATENT DOCUMENTS

| | | | |
|---|---|---|---|
| 0567764 | 11/1993 | European Pat. Off. | 136/256 |
| 1-66974 | 3/1989 | Japan | 136/256 |
| 3-79086 | 4/1991 | Japan | 136/256 |
| 3-165578 | 7/1991 | Japan | 136/256 |
| 3-218684 | 9/1991 | Japan | 136/256 |
| 5-259488 | 10/1993 | Japan | 136/256 |
| 5-326989 | 12/1993 | Japan | 136/256 |
| 5-343721 | 12/1993 | Japan | 136/256 |
| WO94/28588 | 12/1994 | WIPO | 136/256 |

OTHER PUBLICATIONS

D.R. Bickler, *Conference Record, 19th IEEE Photovoltaic Specialists Conf.* (1987), pp. 1424–1429.

A. Cuevas et al, *Conference Record, 21$^{st}$ IEEE Photovoltaic Specialists Conf.* (1990), pp. 327–331.

T. Nunoi et al, *Conference Record, 21$^{st}$ IEEE Photovoltaic Specialists Conf.* (1990), pp. 664–665.

K. Shirasawa et al, *Conference Record, 21$^{st}$ IEEE Photovoltaic Specialists Conf.* (1990), pp. 668–673.

C.M. Chong et al, *Appl. Phys. Lett.*, vol. 52, Feb. 1, 1988, pp. 407–409.

J. C. Zolper, S. Narayanan, S. R. Wenham and M.A. Green. *16.7 Efficient, Laser Textured, Buried Contact Polycrystalline Silicon Solar Cell.* Appl. Phys Lett 55 (22) Nov. 27, 1989, pp. 2363–2365.

(List continued on next page.)

T. W. Tolpin. *Prefront Contract Trench—Structure, Device, Process Sequence For Macro Textured Buried Contact Solar Cells.* Amoco Corp.—Naperville, IL—MetroWest. Mar. 4, 1994.

*Primary Examiner*—Aaron Weisstuch
*Attorney, Agent, or Firm*—Thomas W. Tolpin

[57] ABSTRACT

Textured semi-conductor devices, such as macro textured buried-contact solar cells, are produced with special front contact trenches to increase efficiency and decrease costs. In order to produce the front contact trenches, front channels and narrower metallization grooves are cut in the semi-conductor body. The front contact trenches are plated to form attractive conductive buried contacts comprising flush metallization fingers and bus bars.

19 Claims, 1 Drawing Sheet

OTHER PUBLICATIONS

S. Narayanan, J. Zolper, F. Yun, S.R. Wenham, A.B. Sproul, C.M. Chong and M.A. Green. *18 Efficient Polycrystalline Silicon Solar Cells.* 21$^{st}$ IEEE Photovoltaic Specialists Conference (1990) pp. 678–680.

J.J. Liou. *Detailed Analysis of V–Groove Front Surfaces For Solar Cells.*, International Journal Of Optoelectronics, 1993. vol. 8, No. 2, pp. 109–122.

M. A. Green. *Recent Progress In Crystalline And Polycrystalline Silicon Solar Cells.*, Solar Energy Materials, vol. 23 pp. 111–116 (1991).

M. A. Green, C.M. Chong, F. Zhang, A. Sproul, J. Zolper and S.R. Wenham. *20 Efficient Laser Grooved, Buried Contact Silicon Solar Cells* 20$^{th}$ IEEE Photovoltaic Specialists Conf, 1988. pp. 411–414.

M.A. Green and S. R. Wenham. *High Efficiency Silicon Solar Cells, Present Status.* Optoelectronics. vol. 5, No. 2, pp. 135–142, Dec. 1990.

P. Jenkins, G. A. Landis, N. Fatemi, X. Li, D. Scheiman and S. Bailey. *Increased Efficiency With Surface Texturing In ITO/InP Solar Cells* Apr. 21, 1991, pp. 186–189.

R.S. Wehham, F.Zhang, C.M. Chong and M.A. Green. *Advancements In Silicon Buried Contact Solar Cells* 21$^{st}$ IEEE Photovoltaic Specialist Conference, 1990. pp. 323–326.

H. Bender, J. Szlukcik, H. Nussbaumer, G. Palmers, O. Evrard, J. Nijs, R. Mertens, E. Bucher and G. Willeke. *Polycrystalline Silicon Solar Cells With A Mechanically Formed Texturization.* Appl. Phys. Lett. 62 (23), Jun. 7, 1993. pp. 2941–2943.

T. Nunoi, S. Okamoto, K. Nakajima, S. Tanaka, N. Shibuya, K. Okamoto, T. Nammori, H. Itoh. *Cast Polycrystalline Silicon Solar Cell With Grooved Surface.*, 21$^{st}$ IEEE Photovoltaic Specialists Conf (1990), pp. 664–665.

M.A. Green, S.R. Wenham, F. Zhang, J. Zhao, A. Wang. *Concentrator Silicon Cell Research.* Contractor Report SAND91–7016, pp. 27–28.

FRONT CONTACT TRENCHES FOR POLYCRYSTALLINE PHOTOVOLTAIC DEVICES AND SEMI-CONDUCTOR DEVICES WITH BURIED CONTACTS

RELATED APPLICATIONS

This application is a continuation-in-part of the application of Srinivasomohan Narayanan, John H. Wohigemuth and Steven P. Roncin for "Pre-Isolation Trenches for Polycrystalline Devices and Semi-Conductor Devices With Buried Contacts," U.S. Ser. No. 08/422,051, filed April 14, 1995; which is a continuation-in-part of the application of Srinivasomohan Narayanan, John H. Wohlgemuth and Steven P. Roncin for a "Structure For Use In Producing Semi-Conductor Devices With Buried Contacts And Method For Its Preparation," U.S. Ser. No. 08/342,736, filed Nov. 21, 1994; which is a divisional application of the application of Srinivasomohan Narayanan, John H. Wohlgemuth and Steven P. Roncin for a "Structure For Use In Producing Semi-Conductor Devices With Buried Contacts And Method For Its Preparation," U.S. Ser. No. 08/065,191, filed May 20, 1993, now abandoned.

BACKGROUND OF THE INVENTION

The present invention relates to semiconductor devices with buried contacts and, more particularly, to textured polycrystalline buried contact solar cells.

Polycrystalline and monocrystalline (single crystalline) wafers are useful substrates to fabricate solar cells. Altering the surface topography of solar cells, such as texturing the front surface of solar cells, is useful to trap light, reduce light reflection, and increase efficiency. A large amount of light is coupled into the silicon at very oblique angles and can provide an effective increase in the diffusion length of the substrate with many more carriers being generated within close proximity of the junction. Various techniques have been suggested to provide textured surfaces with pyramids or grooves for wafers and cells. Surface texturing helps redirect reflected light into the cell, reduces grid shadowing, and decreases the reflectance of the active area. Micro texturing can be accomplished, such as by chemical etchants or photolithography, to form small pyramids, inverse pyramids or micro grooves. The results of chemical etchants depend on crystal orientation. Chemical etchants can be useful on monocrystalline (single crystalline) wafers but are not generally useful with polycrystalline silicon with its random orientation of crystal grains. Other techniques can be used for texturing such as laser cutting.

Mechanical texturing increases the current generating capability of buried contact solar cells. Mechanical texturing or macro texturing can be accomplished, such as with a dicing saw, to form larger pyramids or macro grooves. Dicing saws and beveled blades are useful for V-groove formation. Macro texturing provides the best results for polycrystalline wafers which generally do not benefit from conventional chemical texturing. Macro texturing has also yielded cells with higher short circuit current density than that of chemically textured buried contact cells.

Forming macro grooves and metallization grooves by sawing rather than by use of a laser is desirable to form improved semiconductor devices. Where a laser is used, although the grooves need not extend to the edge of the device, the laser must melt the silicon or other material of the wafer causing the groove to, be wider than desired. Wide grooves undesirably result in a less active area for the solar cells. It is desirable to cut grooves as narrow as possible to minimize shadowing. A diamond based dicing saw creates deeper, narrower grooves, which are preferred in the production of semiconductor devices, particularly solar cells. Furthermore, forming grooves by using a laser is relatively slow. Cutting with a saw, particularly a dicing saw, cuts the semiconductor material of the wafer faster than with a laser. During the use of a laser the wafer tends to conduct heat away from the area being melted and silicon is a good heat conductor. Moreover, it is convenient and less expensive to add multiple saw blades to a cutting or milling machine to form parallel grooves, than to attempt to employ multiple laser beam devices.

While macro texturing improves the short circuit current density of the cells and increases the effective surface area of the emitter, it also creates high areas of stress and decreases the open circuit voltage $V_{oc}$ over non-textured cells. Furthermore, macro texturing does not provide a smooth channel of uniform depth for top contact metallization which is necessary to provide electrically conductive contacts but instead causes wavy, zig-zag, or sinusoidal, metal contacts of varying depth. This results in significant higher metallization (plating) costs, greater production time to accommodate more metallization, and increases the volume of metallization and the area of the cell to be in contact with the metal compared with non-textured planar cells.

Macro texturing also increases the metal-silicon contact area which reduces the open circuit voltage of the solar cell. For a solar cell of 11.4 cm x11.4 cm, there are about 2000 macro grooves and 90 metallization fingers (contacts). The surface area of the contact between the heavily diffused regions and the metallization increases by about 18% due to the serpentine pattern.

Buried contacts can be used in solar cells and other semi-conductor devices to enhance efficiency. The metallization grooves cut for buried contacts are preferably cut by sawing rather than with a laser for the reasons described above. When conventional buried contact wafers made by sawing are cut or otherwise separated into solar cells, however, the buried contacts are often cut, which short or shunt the solar cells rendering the solar cells useless.

It is, therefore, desirable to provide improved macro textured buried contact solar cells and other semi-conductor devices which overcome most, if not all, of the preceding problems.

SUMMARY OF THE INVENTION

Improved macro textured buried contact solar cells and other textured semi-conductor devices are produced with front contact trenches and metallization grooves to reduce the surface area of metallization. Front contact trenches are smooth regions cut through the macrotexturing to provide a flat, uniform channel into which contact metallization can be placed. Metallization grooves are channels cut below the front contact trenches, which are then metallized to make buried contacts (e.g., bus bars and metallized fingers). The front contact trenches are particularly useful for macro textured buried contact solar cells in which the textured surface (topography) and trenches are mechanically cut by a dicing saw. Advantageously, macro textured buried contact solar cells with front contact trenches have a higher efficiency for converting sunlight to electricity and have a higher open circuit voltage $V_{oc}$.

Front contact trenches can also be useful in micro textured buried contact solar cells and other semi-conductor devices, in which the textured surfaces and/or trenches are formed by laser cutting, scribing, beam milling, chemical etching, plasma etching, screen printing, or photolithography. For best results, the total depth of the front contact trenches and front contact grooves should be greater than the depth of the textured surface. The textured buried contact solar cells and other semi-conductor devices can also have isolation trenches peripherally surrounding the buried contacts to isolate and prevent shorting and shunting of the buried contacts.

Desirably, the textured buried contact solar cells and other semi-conductor devices can be produced at lower costs in less time and at greater throughput in accordance with the process of the invention. The inventive process also achieves less wastage of metal and lower material requirements. Moreover, textured buried contact solar cells and other semi-conductor devices produced in accordance with the invention are attractive, economical, dependable, and effective.

The improved semi-conductor device has a semi-conductor body with a textured surface which defines an array of peaks and valleys. The textured surface can comprise a macro-textured portion having pyramids, macro-grooves, V-shaped grooves, rounded peaks, or pointed apexes. Channels providing front contact trenches are disposed in the textured surface and extend through a multitude of the peaks to a depth in proximity to the valleys of the textured surface. Metallization grooves communicate with the front contact trenches and extend below both the textured surface and the front contact trenches. The metallization grooves have a narrower width than the front contact trenches. Positioned (seated) in the metallization grooves are metal conductive layers. The metal conductive layers and the metallization grooves cooperate with each other to form generally straight or planar, conductive buried contacts without zig-zag metallization of varying depths. The conductive buried contacts comprise metallization fingers and wider bus bars which are positioned transverse and perpendicular to the metallization fingers. The front contact trenches are preferably covered with insulation to insulate the channel from the conductive buried contacts and prevent shadowing.

In the preferred form, the semi-conductor device has a non-conductive, non-metal edge which provides isolation trenches and comprises a border that peripherally surrounds the metallization grooves. The isolation trenches have a depth greater than the front contact trenches and metallization grooves. Preferably, the isolation trenches are covered with an insulating material to prevent metal from contacting the edge and shunting the semi-conductor device. Advantageously, the isolation trenches and the insulating material cooperate with each other to isolate and insulate the edge of the semi-conductor device from the conductive buried contacts.

In the illustrative embodiment, the semi-conductor device comprises a photovoltaic device or solar cell. The inventive process for producing a photovoltaic device or solar cell comprises preparing a silicon wafer into an array of solar cells with an enhanced efficiency by macro-texturing the silicon wafer to form a macro-textured surface having apexes providing peaks and valleys along a base to reduce reflection of incoming light. The silicon wafer can be a P type polycrystalline wafer, a P type monocrystalline wafer, an N type polycrystalline wafer, or an N type monocrystalline wafer. The macro-textured surface can be formed by pyramid texturing, chemical etching, laser cutting, grinding or sawing. The macro-textured surface can have a topography with pyramids, macro-grooves, V-shaped grooves, slots, concave peaks, convex valleys, or pointed apexes.

Channels providing front contact trenches are formed through a multitude of the apexes to a depth in proximity to the valleys. The front contact trenches can be formed by: laser cutting, sawing, scribing, screen printing, photolithography, chemical etching, plasma etching, electron beam cutting, grinding or sawing. The sawing is preferably followed by etching to reduce saw damage.

The wafer is subjected to diffusion. An emitter and photovoltaic junction is formed in the wafer by diffusing opposite type polarity regions in the silicon wafer beneath the front contact trenches, including an active region and an area beneath the front contact trenches. The opposite type polarity region can be an $N^+$ region for a P type polycrystalline wafer, an $N^+$ region for a P type monocrystalline wafer, a $P^+$ region for an N type polycrystalline wafer, and a $P^+$ region for an N type monocrystalline wafer.

The front contact trenches can be insulated with silicon oxide, silicon nitride, or oxided materials, to substantially prevent shadowing and metallization of the front contact trenches. In order to substantially prevent zig-zag metallization of varying depths in the groove and the front contact trenches, front contact grooves are cut in the silicon wafer through the front contact trenches to a depth substantially below the valleys and base of the macro-textured surface. The front contact grooves preferably have a width less than the front contact trenches. Another opposite type polarity region can be diffused in the silicon wafer beneath the grooves. This opposite polarity region can be an $N^{++}$ region for a P type polycrystalline wafer, an $N^{++}$ region for a P type monocrystalline wafer, a $P^{++}$ region for an N type polycrystalline wafer; or a $P^{++}$ region for an N type monocrystalline wafer; Conductive buried contacts having a substantially uniform depth are formed by plating and filling the front contact grooves with a metal conductive layer of nickel, copper, silver, or combinations thereof.

In order to prevent shunting of the conductive buried contacts in the photovoltaic device, isolation trenches can be cut into the silicon wafer before cutting the front contact trenches. The isolation trenches should be cut to a depth greater than the combined depths of the front contact trenches and grooves. A border for the solar cells can be located at a position on the silicon wafer to peripherally surround and be spaced from the conductive buried contacts and grooves. The border can be formed by forming an insulated edge adjacent the isolation trenches. Opposite type polarity regions can be diffused in the wafer beneath the isolated trenches concurrently with the diffusing of the opposite type polarity regions beneath the front contact trenches. The opposite type polarity regions can comprise: an $N^+$ region for a P type polycrystalline wafer, an $N^+$ region for a P type monocrystalline wafer, a $P^+$ region for an N type polycrystalline wafer; and a $P^+$ region for an N type monocrystalline wafer. Metal is substantially prevented from contacting the edge and shorting the conductive buried contacts, by depositing and substantially covering the isolation trenches with insulation to provide an insulation barrier isolating and insulating the conductive buried contacts so as to enhance the efficiency of the solar cells. The insulation can comprise silicon oxide, silicon nitride, or oxided materials. The isolation trenches are subsequently cut to separate the solar cells. The isolation of the semiconductor devices does not require the cutting of conductive elements or materials and avoids the deterioration in the efficiency of such devices normally occurring in prior art conventional devices as a result of the cutting operation.

In the preferred process, macro-texturing comprises sawing the silicon wafer with a dicing saw to from a parallel set of V-shaped texturing grooves peripherally surrounded by the isolation trenches, and etching the V-shaped texturing grooves to reduce saw damage. The front contact trenches, metallization grooves and isolation trenches can be cut with a dicing saw and are preferably etched after being sawed to reduce saw damage.

A more detailed explanation of the invention is provided in the following description and appended claims taken in conjunction with the accompanying drawing.

DESCRIPTION OF THE PREFERRED EMBODIMENT

Figure 1:
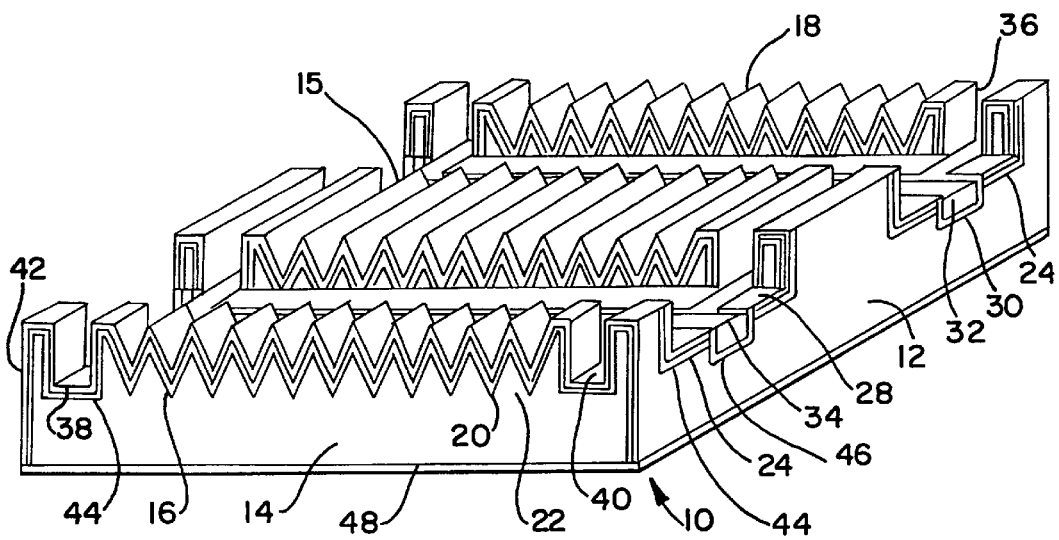
FIG. 1 is a perspective view of a portion of a textured polycrystalline photovoltaic device produced in accordance with the present invention.
Figure 2:
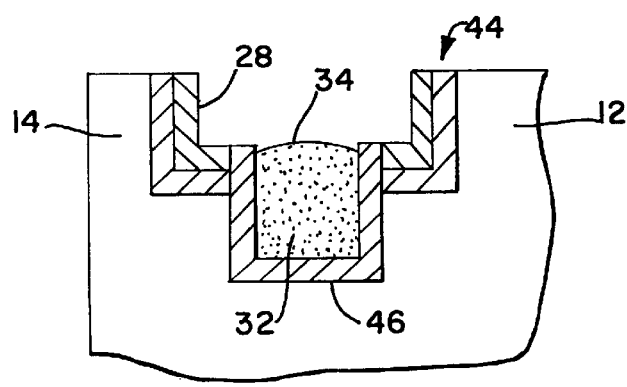
FIG. 2 is a an enlarged cross sectional view of a contact trench of the textured polycrystalline photovoltaic device.

The textured photovoltaic device 10 of FIG. 1 provides a solar cell 12 which comprises a silicon wafer 14. The wafer can be a monocrystalline wafer or a polycrystalline wafer. The wafer has a textured surface 15 to decrease reflection of light and increase photovoltaic efficiency. The textured surface has parallel V-shaped texturing grooves 16 with apexes 18 and valleys 20 along a base 22.

The silicon wafer has a parallel set of channels 24 which provide front contact trenches. Preferably, the front contact trenches 24 extend entirely across the textured surface of the wafer. The front contact trenches also extend through a substantial amount of the apexes to a depth adjacent the valleys and base of the textured surface. In the preferred embodiment, the front contact trenches are etched sawed front contact trenches which are formed by a dicing saw and subsequent etching. The front contact trenches can have a depth of 30–90 microns, preferably 50–70 microns. For the metallization fingers, the front contact trenches can have a width of 30–150 microns. For bus bars, the front contact trenches can have a width of 1.8–2 mm (1800–2000 microns). The bus bars are perpendicular to the metallization fingers. The front contact trenches are covered with insulation 28 comprising silicon oxide, silicon nitride, or oxided materials to prevent the conductive metal buried contacts from engaging and contacting the front contact trenches and causing shadowing which would decrease the efficiency of the solar cell.

In order to minimize zig-zag, serpentine and sinusoidal metallization, a set of metallization grooves 30 extend below, communicate with, and are aligned in registration with the front contact trenches. The metallization grooves extend below the valleys and base of the textured surface and span a width less than the maximum width (span) of the front contact trenches. In the preferred embodiment, the metallization grooves are etched sawed grooves which are formed by a dicing saw and subsequent etching. The metallization grooves can have a depth of 30–70 microns below the front contact trenches. The metallization grooves for the metallization fingers are referred to as metallization finger grooves and have a width of 10–100 microns. The bus bars can be formed by cutting parallel bus bar grooves of similar depth as the metallization finger grooves. The bus bar grooves can have a pitch of 45 microns. Each bus bar can comprise 44–60 grooves. The metallization grooves comprising the metallization finger grooves 32 and bus bar grooves, are filled and plated with metal selected from nickel, copper, and/or silver. Advantageously, the metallization grooves and the metal conductive layers cooperate with each other to form conductive buried contacts 34 which are positioned below the valleys and base of the textured surface. The conductive buried contacts preferably have a substantially uniform depth below the front contact trenches and are substantially straight and coplanar. Desirably, the conductive buried contacts cooperate with the front contact trenches to enhance the open circuit voltage of the photovoltaic device. In the preferred embodiment, the metallization fingers, metallization grooves and the contact trenches for the metallization fingers are positioned transverse and perpendicular to the V-shaped texturing grooves, while the bus bars, bus bar grooves, and front contact trenches for the bus bars are positioned parallel to the V-shaped texturing grooves.

The wafer has a non-conductive, insulated, non-metal edge 36 which provides a border that peripherally surrounds the grooves. Preferably, the edge provides isolation trenches 38 which are deeper than the combined depth of the front contact trenches and the V-shaped texturing grooves. In the preferred embodiment, the isolation trenches are etched sawed isolation trenches formed by a dicing saw and subsequent etching. The isolation trenches can have a depth of 50–100 microns; preferably 50–70 microns, and can have a width of about 40–100 microns. The isolation trenches are covered with insulating material 40 (insulation) comprising silicon oxide, silicon nitride, or oxided materials to prevent the metal conductive, buried contacts from contacting the edge and shorting the solar cell. Desirably, the insulation cooperates with the isolation trench to isolate and insulate the edge of the solar cell from electrical contacts.

In photovoltaic devices with a P type polycrystalline wafer, a phosphorous silicon diffused layer 42 is included to provide $N^+$ regions 44 beneath the isolation trench, the front contact trenches and in the textured area, and $N^{++}$ regions 46 beneath the metallization grooves. Boron can be used as a P dopant. Phosphorous can be used as an N dopant. In some circumstances it may be desirable to use other types of P dopants and N dopants.

A preferred process for producing the solar cells is described below. The wafers (solar cells) can be etched in hot, concentrated sodium hydroxide to remove saw damage. Some silicon is removed during this step. The wafers can then rinsed in a mixture of de-ionized (DI) water and hydrochloric acid (HCl) to remove any remaining sodium hydroxide.

The surface of the wafers is textured by mechanical texturing, preferably with a dicing saw. A preferred approach to mechanical surface texturing is to use a beveled blade. A 60 or 70° blade produces a V-grooved surface. With a single layer antireflective coating, a mechanically textured silicon surface results in much lower surface reflection than a planar surface with the same single layer antireflective coating. More energy will be absorbed by the textured surface at all wavelengths of the solar spectrum, thereby increasing the current and efficiency of the cell. When optimized, mechanical texturing produces as good an optical coupling surface as chemical texturing. Solar cells made with mechanically textured surfaces and the inventive process have a high current density as well as a good fill factor and an excellent open circuit voltage.

Pre-isolation (PIT) trenches are preferably cut in the wafer with a dicing saw. Pre-isolation trenches are formed along the perimeter of the wafer to facilitate junction isolation at the end of the cell processing. The depth of the PIT trenches can be about 10–20 microns more than that of the surface texturing.

Desirably, pre-front contact (Prefct) trenches are then cut into the wafer with a dicing saw. Lateral and longitudinal, pre-front contact (Prefct) trenches are formed in the regions where the metallization fingers (buried contacts) and bus bars (wider buried contacts) will be located. The front contact trenches for the bus bars are perpendicular and transverse to and wider than the front contact trenches for the metallization fingers. The depth of the front contact trenches can be about the depth of the surface texturing. The front contact trenches are aligned in registration with the front contact grooves which are subsequently formed.

The (PIT and Prefct) trenches can be etched, also referred to as groove etching, by a potassium hydroxide etch and a de-ionized water rinse. More specifically, after formation of the front contact trenches and grooves, the wafers can be etched in KOH to remove saw damage and contamination. The wafers can then rinsed in Dl (de-ionized) water and cleaned in HCl to remove any sodium contamination. Before the wafers are loaded into the phosphorous diffusion tube, they can be cleaned again. The wafers can be subjected to pre-diffusion cleaning with hydrochloric acid, nitric acid and hydrofluoric acid. Pre-diffusion cleaning comprises cleaning the wafers in HCl, HF/$HNO_3$ and HF with a de-ionized (Dl) water rinse after each step. The pre-diffusion cleaning steps assures that the wafers are free from contamination before they are processed at higher temperatures.

The front junction of the cells can be formed by phosphorous diffusion comprising a phosphorus deposition step. The other heat treatments in the process sequence facilitate this diffusion. The resultant emitter sheet resistivity after all of the process heat treatments can be approximately 80–120 ohms/square.

Thermal oxidation of the wafers can then be accomplished by exposing the wafers to wet steam to form an insulative oxide layer, such as from 2500 to 3000 Å thick. For example, during thermal oxidation, about 3000 Å (1000 Å=1 micometer) of thermal oxide is grown on the wafers using steam. This oxide has several functions. It serves as a diffusion mask during the phosphorus diffusion of the grooves and as plating mask when the grooves are plated with cooper and nickel. Finally, the oxide can be etched back, such as to 1000 Å to serve as an anti-reflection coating.

Front contact grooves can be aligned and cut through the front contact trenches with a dicing saw. A laser was initially used to produce the front contact grooves. The front contact grooves scribed by the laser were shallow and wide. They were intended to be 50 microns deep and 20 microns wide, but the ones obtained using the laser were about 40 microns deep and 30 microns wide. The laser process was also slow. Since concentrator cells require many more grid lines than one sun cells and since the laser had to scan each groove in sequence, laser technology may not be cost effective for concentrator cells. Preferably, a dicing saw is used to produce front contact grooves that are 50 microns deep and 20 microns wide. While a single blade saw may take as long as a laser, saws are available with many blades so that even concentrator cells may be grooved in a few passes. Front contact grooves about 30 microns deep and 25 microns wide were cut in the front contact trenches. The uncut areas of front contact trenches are already covered by a thick oxide insulative coating providing insulation.

The front contact grooves can be etched with a potassium hydroxide etch and a deionized water rinse. After the front contact grooves are etched, the wafer can be diffused with phosphorus. The silicon dioxide insulating coating limits the diffusion to the grooved areas. A very high surface concentration of phosphorus leads to the formation of a low resistance ohmic contact between the plated nickel and silicon. The groove diffusion can be performed e.g. at 880° C. for about 4 hours using a solid source, yielding a sheet resistance of approximately 5 to 10 ohms per square.

The wafers can be etched in dilute hydrofluoric acid (HF) to remove the phosphorus rich oxide from in the grooves. The thicker oxide on the front of the wafers can be etched down, such as to approximately 1000 Å, to serve as the cell anti-reflective coating. Optimization of the etching step is desirable as longer etching time can result in removal of oxide on the peaks of the pyramids (surface texturing) thereby leading to plating of metal in these areas. Insufficient etching can result in non-uniform plating. The wafers can be then rinsed in de-ionized (Dl) water to remove the HF. Insufficient rinsing can result in etching of the oxide during plating by remnant HF.

After the de-ionized water rinse, the wafers can be placed in an electroless nickel plating bath. A recirculating plating bath that holds many wafers per batch can be used. Recirculating capability is useful to maintain constant temperature. After plating, the wafers can be rinsed in Dl (de-ionized) water and dried. The nickel plated grooves can then be filled with copper, or other suitable metal, using electroless or electroplating. The Cu plating preferably fills the grooves uniformly without leaving voids.

Only the grooves on the front of the wafers are plated, because the rest of the cell including the rear is masked by the insulating oxide. The back contact is preferably formed by the high throughput, back arc spray process described in U.S. Pat. No. 4,297,391 to attain back metallization. This procedure can eliminate aluminum evaporation and the high temperature sintering steps and reduces the plated area of the cell by 95%. This procedure also desirably lowers plating cost per cell and improves plating throughput.

The wafer can be separated into individual solar cells by cutting the wafer through the isolation trenches (peripheral edges), such as starting with the bottoms of trenches and continuing through the semiconductor body or starting at the back and cutting through the bottoms of the trenches. A saw is preferably used rather than a laser for many of the reasons discussed above, and particularly as a saw does not melt the material and generate heat to the same extent as does a laser. Preferably a diamond saw blade is utilized to enable cutting to a narrow width, thus reducing wastage, and with the generation of a minimum amount of heat. In this manner, the wafer is separated into a plurality of cells or devices having top edges which are substantially free of conductive material in unwanted areas, i.e. free of metal, except at the desired contact areas. The isolation trenches provide a border, barrier and edge(s) which peripherally surround and isolate the grooves and conductive buried contacts from the edge(s) of the solar cells. The insulated isolated trenches prevent metal from contacting the edge(s) and shorting/shunting the conductive buried contacts of the solar cells.

EXAMPLE 1

The front surfaces of three polycrystalline wafers (solar cells) were treated as follows. The first wafer identified as B53-SX-4, was chemically polished by chemically etching the wafer with a solution containing nitric acid and hydrofluoric acid. The chemically polished front surface had a mirror-like polish with a roughness less than 5 microns. The front surface of the first wafer provides a flat or planar non-textured surfaces. The front surface of the second wafer identified as Z59-SX-3, was macro textured by laser scribing parallel lines followed by chemical etching. The surface of the second wafer had rounded peaks and valleys, also referred to as corrugated trench structure with rounded pyramids ranging from 40–80 microns, typically 80 microns. The front surface of the third wafer was macro textured to form upright flat top (frusto-conical) pyramids by laser scribing a matrix of longitudinal parallel lines and lateral (transverse) parallel lines. The longitudinal and lateral parallel lines were perpendicular to each other and intersected at right angles. The flat top pyramids had a typical height of 50 microns and a flat square surface with sides about 10–50 microns. The solar cells were tested for open circuit voltage ($V_{oc}$), short current Bdensity ($J_{sc}$), fill factor (FF), and efficiency (Eff.). The results are indicated below in Table 1. The non-textured chemical polished wafer had a higher $V_{oc}$ and FF, but lower current and efficiency than the textured wafers.

TABLE 1

| Cell ID | $V_{OC}$ (mV) | $J_{SC}$ (mA/cm$^2$) | FF (%) | Eff. (%) | Surface Conditions |
|---|---|---|---|---|---|
| B53-SX-4 | 601 | 32.1 | 77 | 14.7 | Chemically polished (Planar) |
| Z59-SX-3 | 595 | 35.6 | 76 | 16.1 | Trench structure (Macro Textured) |
| Z59-SX-5 | 587 | 36.9 | 76 | 16.4 | Upright pyramids (Macro Textured) |

EXAMPLE 2

The front surfaces of two other polycrystalline wafers (solar cells) were treated as follows. One wafer was textured similarly to Z59-SX-3 of Table 1 but also had front contact trenches (Prefct) and metallization grooves cut therein with a dicing saw as described above. The other wafer was non-textured, planar (but not polished) after being etched in sodium hydroxide. The polycrystalline solar cells were tested for open circuit voltage ($V_{oc}$), short circuit current ($I_{sc}$), fill factor (FF), and efficiency (Eff.). The results appear in Table 2. The textured Prefct wafer with front contact trenches and metallization grooves had the same $V_{oc}$ and FF as the planar non-textured wafer and had a greater efficiency and $J_{sc}$.

TABLE 2

| $V_{OC}$ (mV) | $J_{SC}$ (mA/cm$^2$) | FF (%) | Eff. (%) | Remarks |
|---|---|---|---|---|
| 601 | 31.0 | 77 | 14.7 | Macro Textured |
| 601 | 28.6 | 77 | 13.5 | Planar |

EXAMPLE 3

The front surfaces of two monocrystalline wafers were treated as follows. The first monocrystalline wafer was non-textured and planar or flat after being etched in sodium hydroxide. The second monocrystalline wafer was textured similarly to Z59-5X-3 of Table 1 but also had front contact trenches (Prefct) and metallization grooves cut therein with a dicing saw as described above. The monocrystalline solar cells were tested for $V_{oc}$, $J_{sc}$ and efficiency (Eff.). The textured Prefct monocrystalline wafer had a greater $V_{oc}$, $J_{sc}$ and efficiency than the planar non-textured monocrystalline wafer and had the same FF.

TABLE 3

| $V_{OC}$ (mV) | $J_{SC}$ (mA/cm$^2$) | FF (%) | Eff. (%) | Remarks |
|---|---|---|---|---|
| 599 | 27.6 | 77 | 12.72 | Planar |
| 604 | 29.3 | 77 | 13.63 | Macro Textured |

EXAMPLE 4

Other solar cells (wafers) were prepared from the same silicon wafer batch. Isolation (PIT) trenches were cut in two of the wafers. In the other wafers, the PIT trenches were omitted. The wafers were cut into cells from the top or bottom as indicated below. The resulting cells were measured for efficiency of converting sun light (solar energy) into electrical energy using AM 1.5 illumination at 100 mW/cm$^2$.

| Efficiency of Converting Solar Energy To Electrical Energy | |
|---|---|
| Sample | % Efficiency |
| Without Isolation Trenches | |
| Cutting From Top | 11.5% |
| Cutting From Bottom | 13.0% |
| With Isolation Trenches | |
| Cutting From Top | 14.2% |
| Cutting From Bottom | 14.7% |

While a particular embodiment of the semiconductor structure and method of the invention has been shown and described, it will be appreciated by those skilled in the art that changes and modifications may be made thereto without departing from the invention in its broader aspects and as set forth in the following claims.

What is claimed is:

1. A semi-conductor device, comprising:
    a semi-conductor body having a textured surface defining an array of peaks and valleys;
    a channel disposed in said textured surface and extending through a multitude of said peaks to a depth in proximity to said valleys;
    a groove extending below said channel beneath said textured surface and said groove having a width narrower than said channel;
    a metal conductive layer positioned in said groove; and
    said metal conductive layer and said groove cooperating with each other to form a conductive buried contact substantially in the absence of zig-zag metallization of varying depths in said groove and channel.

2. A semi-conductor device in accordance with claim 1 including insulation disposed in said channel to insulate said channel from said conductive buried contact.

3. A semi-conductor device in accordance with claim 1 wherein:
    said semi-conductor body has an edge in the absence of metal, said edge providing a border peripherally surrounding said groove, said edge defines an isolation trench, and said isolation trench has a depth greater than said channel and groove;
    insulating material disposed in and substantially covering said isolation trench to substantially prevent metal from contacting said edge and shunting said semi-conductor device; and said isolation trench and said insulating material cooperating with each other to isolate and insulate the edge of the semi-conductor device from said conductive buried contact.

4. A semi-conductor device in accordance with claim 3 wherein:

said channel comprises an etched sawed channel; said groove comprise an etched sawed groove;

said isolation trench comprises an etched sawed trench; and said metal conductive layer is selected from the group consisting of nickel, copper, silver, and combinations thereof.

5. A semi-conductor device in accordance with claim 3 including a diffused layer providing opposite conductivity regions beneath said isolation trench, channel, and groove.

6. A semi-conductor device in accordance with claim 1 wherein said textured surface comprises a textured portion selected from the group consisting of pyramids, macrogrooves, V-shaped grooves, rounded peaks, pointed apexes, and combinations thereof.

7. A semi-conductor device in accordance with claim 1 comprising a photovoltaic device or solar cell.

8. A photovoltaic device, comprising:

a silicon wafer selected from the group consisting of a polycrystalline wafer and a monocrystalline wafer, said silicon wafer providing a solar cell, said silicon wafer having a textured surface for decreasing reflection of light and increasing photovoltaic efficiency, and said textured surface having apexes and a base;

said silicon wafer defining a substantially parallel set of channels providing front contact trenches extending substantially across said textured surface for enhancing trapping of light, said front contact trenches extending through a substantial amount of said apexes to a depth adjacent said base of said textured surface;

insulation positioned within and substantially engaging and covering said front contact trenches to substantially prevent metal from contacting said front contact trenches so as to minimize shadowing, said insulation comprising at least one insulating material selected from the group consisting of silicon oxide, silicon nitride, and oxided materials;

said silicon wafer defining a set of metallization grooves aligned in registration with and extending below said front contact trenches, said grooves extending beneath said base of said textured surface and spanning a width less than said front contact trenches, and said metallization grooves comprising metallization finger grooves and bus bar grooves;

metal conductive plating substantially filling said metallization grooves, and providing metal conductive layers selected from the group consisting of nickel, copper, silver, and combinations thereof, and said metal conductive layers comprising metallization fingers and bus bars;

said metallization grooves and said metal conductive layers cooperating with each other to form conductive buried contacts positioned substantially below the base of said textured surface, said conductive buried contacts having a substantially uniform depth below said front contact trenches and being substantially coplanar; and said front contact trenches and said conductive buried contacts cooperating with each other to enhance the open circuit voltage of said photovoltaic device.

9. A photovoltaic device in accordance with claim 8 wherein:

said textured surface defines substantially parallel V-shaped texturing grooves;

said metallization fingers, metallization finger grooves, and front contact trenches for said metallization fingers are positioned transverse to said V-shaped texturing grooves; and said bus bar, bus bar grooves, and front contact trenches for said bus bar are positioned substantially parallel to said V-shaped texturing grooves.

10. A photovoltaic device in accordance with claim 8 wherein:

said front contact trenches define etched sawed front contact trenches formed by a dicing saw and subsequent etching;

said metallization grooves define etched sawed grooves formed by a dicing saw and subsequent etching;

said wafer has an edge in the absence of metal, said edge providing a border peripherally surrounding said grooves, said edge defining an isolation trench, and said isolation trench being deeper than said front contact trenches and said grooves;

insulating material positioned within and substantially engaging and covering said isolation trench to substantially prevent metal from contacting said edge and shorting said solar cell, said insulating material comprising at least one insulating material selected from the group consisting of silicon oxide, silicon nitride, and oxided materials; and said isolation trench and said insulating material cooperate with each other to isolate and insulate the edge of the solar cell from said conductive buried contacts.

11. A photovoltaic device in accordance with claim 10 including a phosphorous silicon diffused layer providing $N^+$ regions beneath said isolation trench and said front contact trenches, and $N^{++}$ regions beneath said metallization grooves; and wherein said isolation trench comprises an etched sawed isolation trench formed by a dicing saw and subsequent etching.

12. A photovoltaic device in accordance with claim 10 wherein:

said front contact trenches for said metallization fingers have a width of about 30–150 microns and a depth of about 30–90 microns;

said metallization finger grooves have a depth from about 30–70 mm below said front contact trenches for said metallization fingers;

said front contact trenches for said bus bars have a width of about 1.8–2 microns and a depth of about 30–90 microns;

said bus bar grooves have a depth of 30–70 microns below said front contact trenches for said bus bar, and about 44–60 bus bar grooves are associated with each bus bar.

13. A photovoltaic device in accordance with claim 12 wherein said isolation trench has a depth of about 50–100 microns and a width of about 40–100 microns.

14. A process for producing a photovoltaic device, comprising the steps of:

preparing a silicon wafer selected from the group consisting of a P type polycrystalline wafer, a P type monocrystalline wafer, an N type polycrystalline wafer, and an N type monocrystalline wafer, into an array of solar cells with an enhanced efficiency by macro-texturing said silicon wafer to form a macro-textured surface having apexes providing peaks and valleys along a base to reduce reflection of incoming light;

forming channels providing front contact trenches through a multitude of said apexes to enhance trapping of light, said channels being cut from said peaks to a depth in proximity to said valleys;

forming an emitter and a photovoltaic junction in said wafer by diffusing opposite type polarity regions in said silicon wafer including an active region and an area beneath said front contact trenches, said opposite type polarity regions being selected from the group consisting of an $N^+$ region for a P type polycrystalline wafer, an $N^+$ region for a P type monocrystalline wafer, a $P^+$ region for an N type polycrystalline wafer, and a $P^+$ region for an N type monocrystalline wafer;

insulating said front contact trenches with at least one insulating material selected from the group consisting of silicon oxide, silicon nitride, and oxided materials, to substantially prevent shadowing and metallization of said front contact trenches;

cutting metallization grooves in said silicon wafer having a width less than said channels, said grooves being aligned and cut through said front contact trenches to a depth substantially below said valleys and base of said macro-textured surface;

diffusing another opposite type polarity region in said silicon wafer beneath said metallization grooves, said another opposite polarity region being selected from the group consisting of an $N^{++}$ region for a P type polycrystalline wafer, an $N^{++}$ region for a P type monocrystalline wafer, a $P^{++}$ region for an N type polycrystalline wafer; and a $P^{++}$ region for an N type monocrystalline wafer;

forming conductive buried contacts having a substantially uniform depth by plating and substantially filling said grooves with a metal conductive layer selected from the group consisting of nickel, copper, silver, and combinations thereof;

substantially preventing zig-zag metallization of varying depths in said groove and said front contact trenches.

15. A process for producing a photovoltaic device in accordance with claim 14 wherein:

said forming of said channels to provide said front contact trenches comprises a cutting procedure selected from the group selected consisting of laser cutting, sawing, scribing, screen printing, photolithography, chemical etching, plasma etching, and electron beam cutting;

said macro-textured surface comprises a macro-textured portion selected from the group consisting of pyramids, macro-grooves, V-shaped grooves, slots, concave peaks, convex valleys, pointed apexes, and combinations thereof;

said macro-texturing comprises a macro-textured procedure selected from the group consisting of pyramid texturing, chemical etching, laser cutting and sawing; and said sawing includes etching to reduce saw damage.

16. A process for producing a photovoltaic device in accordance with claim 14 wherein:

said forming of said channels comprises sawing front contact trenches substantially across said wafer with a dicing saw and etching said front contact trenches to remove saw damage; and said cutting of said metallization grooves comprises sawing metallization grooves substantially across said wafer with a dicing saw and etching said grooves to remove saw damage and enhance metallization.

17. A process for producing a photovoltaic device in accordance with claim 14 including substantially preventing shunting of said conductive buried contacts by:

cutting isolation trenches into said silicon wafer before cutting said channels providing said front contact trenches, and said isolation trenches being cut to a depth greater than the combined depths of said front contact trenches and grooves;

diffusing further opposite type polarity regions in said wafer beneath said isolated trenches concurrently with said diffusing of said opposite type polarity regions beneath said front contact trenches, said further opposite type polarity region being selected from the group consisting of an $N^+$ region for a P type polycrystalline wafer, an $N^+$ region for a P type monocrystalline wafer, a $P^+$ region for an N type polycrystalline wafer; and a $P^+$ region for an N type monocrystalline wafer;

forming an edge in the absence of metal with said isolation trenches to provide a border for said solar cells, said border being located at a position on said silicon wafer to peripherally surround and be spaced from said conductive buried contacts and grooves;

substantially preventing metal from contacting said edge and shorting said conductive buried contacts by depositing and substantially covering said isolation trenches with insulation comprising at least one insulating material selected from the group consisting of silicon oxide, silicon nitride, and oxided materials, to provide an insulation barrier isolating and insulating said conductive buried contacts so as to enhance the efficiency of said solar cells; and cutting through said isolation trenches to separate said solar cells.

18. A process for producing a photovoltaic device in accordance with claim 17 wherein:

said macro-texturing comprises:
sawing said silicon wafer with a dicing saw to from a substantially parallel set of V-shaped grooves peripherally surrounded by said isolation trenches, and
etching said V-shaped grooves to reduce saw damage; and said cutting of said isolation trenches comprises
sawing said isolation trenches in said wafer with a dicing saw, and
etching said isolation trenches to reduce saw damage in said isolation trenches.

19. A process for producing a photovoltaic device in accordance with claim 17 wherein:

said front contact trenches are sawed to a depth of about 30–90 microns;

said metallization grooves are sawed to a depth of about 30–70 microns below said front contact trenches at of width of 10–100 microns; and said isolation trenches are cut with a dicing saw to a depth of about 50–100 microns at a width of about 40–100 microns.

* * * * *

UNITED STATES PATENT AND TRADEMARK OFFICE
CERTIFICATE OF CORRECTION

PATENT NO. : 6,084,175
DATED : July 4, 2000
INVENTOR(S) : James M. Perry, Srinvasomohan Narayanan, John H. Wohlgemuth, Steven P. Roncin It is certified that error appears in the above-identified patent and that said Letters Patent is hereby corrected as shown below:

Title page,
Inventors: Srinvasamohan Narayanan," should read: -- Srinvasomohan Narayanan, --

Column 1,
Line 8, "John H. Wohigemuth" should read: -- John H. Wohlgemuth --

Column 6,
Line 45, acid (HCI) to remove" should read: -- acid (HCl) to remove --

Column 7,
Lines 17 and 18, "D1 (de-ionized) water and cleaned in HCI to" should read:
-- DI (de-ionized) water and cleaned in HCl to --
Line 24, "de-ionized (D1) water" should read: -- de-ionized (DI) water --

Column 8,
Line 22, "be rinsed in D1" should read: -- be rinsed in DI --

Column 9,
Line 13, "short current Bdensity" should read: -- short current density --

Signed and Sealed this

Eighth Day of January, 2002

*Attest:*

JAMES E. ROGAN
*Attesting Officer*     *Director of the United States Patent and Trademark Office*